United States Patent [19]
Tsuji

[11] Patent Number: 5,644,163
[45] Date of Patent: Jul. 1, 1997

[54] SEMICONDUCTOR DEVICE

[75] Inventor: Ken-ichiro Tsuji, Kawasaki, Japan

[73] Assignee: Kabushiki Kaisha Toshiba, Kawasaki, Japan

[21] Appl. No.: 617,956

[22] Filed: Mar. 11, 1996

Related U.S. Application Data

[63] Continuation of Ser. No. 382,787, Feb. 2, 1995, abandoned.

[30] Foreign Application Priority Data

Feb. 3, 1994 [JP] Japan .................................. 6-030814

[51] Int. Cl.⁶ .......................... H01L 23/10; H01L 23/34; H05K 7/20
[52] U.S. Cl. .......................... 257/706; 257/705; 257/712; 257/713; 361/702
[58] Field of Search ...................... 257/706, 704, 257/705, 712, 713, 718, 717; 361/688, 702, 703, 704, 707, 714

[56] References Cited

FOREIGN PATENT DOCUMENTS

| | | | |
|---|---|---|---|
| 61-04250 | 1/1986 | Japan | 257/706 |
| 3256351 | 11/1991 | Japan | 257/712 |
| 4078159 | 3/1992 | Japan | 257/713 |

*Primary Examiner*—Mahshid D. Saadat
*Assistant Examiner*—Jhihan B. Clark
*Attorney, Agent, or Firm*—Finnegan, Henderson, Farabow, Garrett & Dunner, L.L.P.

[57] ABSTRACT

In a semiconductor device, a heat sink is fitted in an opening in a ceramics plate and a semiconductor element is mounted on the heat sink. A cap is fixed by a sealing ring to the surface of the ceramics plate so as to protect the semiconductor element. Connection pins are provided on the outer marginal surface portion of the ceramics plate. The opening of the ceramics plate is square in configuration and has a curvature radius R of R=1.0 mm at its corners, that is, has no angular corners, so that stress, being produced at the corner, is relieved.

19 Claims, 8 Drawing Sheets

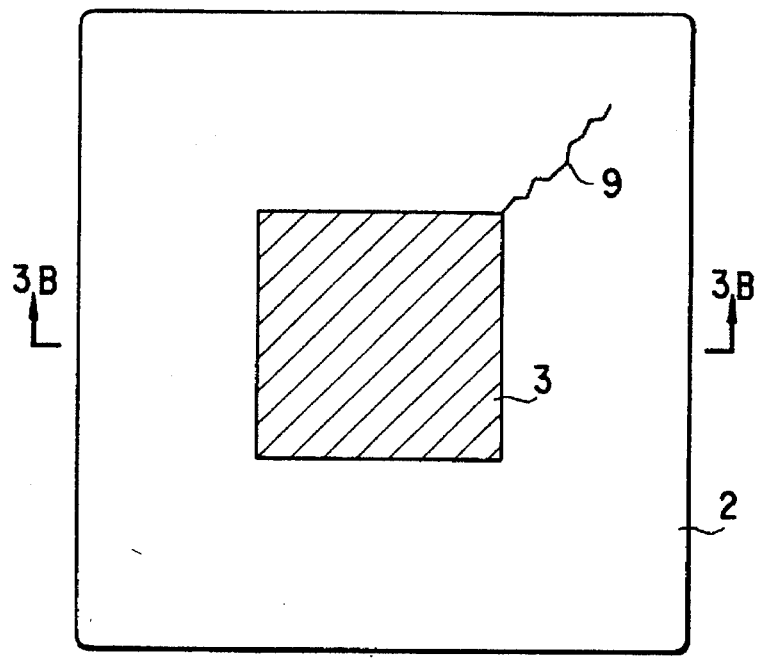
F I G. 3A
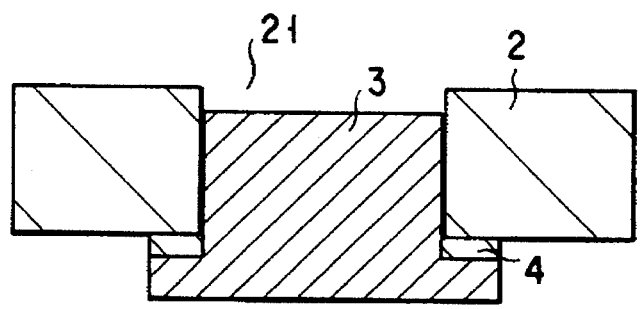
F I G. 3B

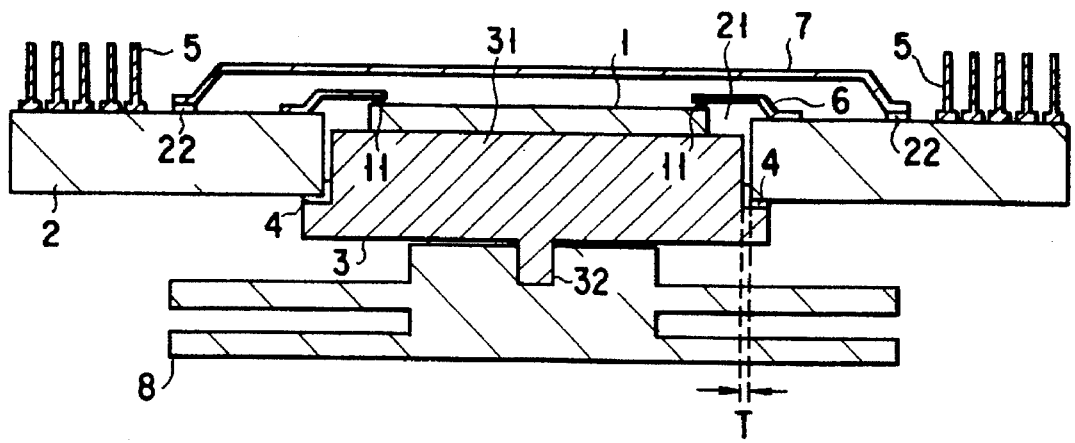
F I G. 6
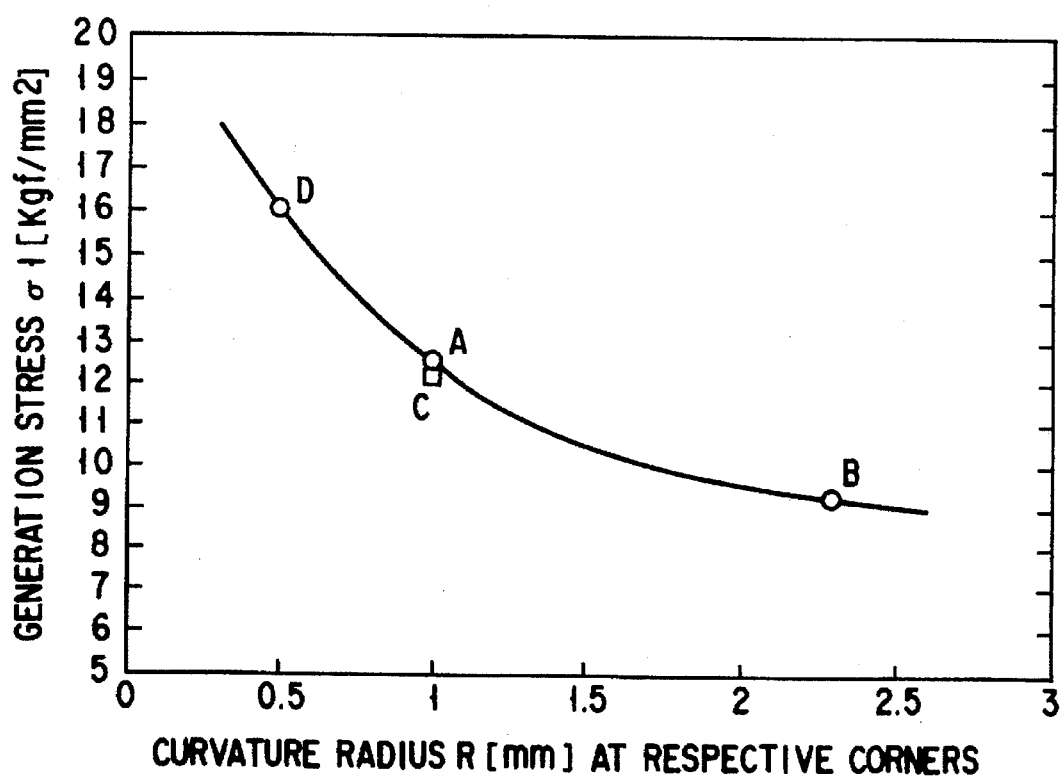
F I G. 7

| SHAPE OF CERAMICS PLATE | STRESS $\sigma_2$ UPON ASSEMBLY | STRESS $\sigma_1$ UPON THERMAL SHOCK TESTING AND BREAKAGE PROBABILITY |
|---|---|---|
| A | 8.66 | $\sigma_1 = 12.4$<br>F = 5.8 |
| B | 6.27 | $\sigma_1 = 9/18$<br>F = 0.049 |
| C | 8.60 | $\sigma_1 = 12.1$<br>F = 4.0 |
| D | 11.5 | $\sigma_1 = 16.1$<br>F = 98 |

FIG. 14

SEMICONDUCTOR DEVICE

This application is a continuation of Ser. No. 08/382,787, filed Feb. 2, 1995 now abandoned.

BACKGROUND OF THE INVENTION

1. Field of the Invention

The present invention relates to a semiconductor device and, in particular, to a structure of a ceramics package with a semiconductor element sealed therein.

2. Description of the Related Art

Conventionally, ceramics, resin, insulators, etc., have been employed as a principle material for a package with a semiconductor element, such as an IC and an LSI element, incorporated therein. Further, a heat sink is often attached to the package to radiate heat evolved from the semiconductor element.

FIG. 1 is a cross-sectional view showing a conventional semiconductor device. The semiconductor device is housed in a ceramics package. FIG. 2 is a bottom view of a ceramics package as seen from the bottom side of the semiconductor device shown in FIG. 1, that is, a view of the ceramics package with a cap, a semiconductor element and connection leads omitted. The cross-sectional view of FIG. 1 corresponds to that as taken along line 1—1 in FIG. 2.

As shown in FIGS. 1 and 2, a ceramics plate 2 made of alumina ($Al_2O_3$ 90 wt %) constitutes a package. A multi-layered interconnection pattern, not shown, is formed at those areas of the lower surface and interior of the ceramics plate. The ceramics plate 2 is provided by stacking a plurality of green sheets with a conductive layer coated to provide the interconnection pattern on their surfaces and baking a resultant structure. An opening 21 is provided at the central area of the ceramics plate. A heat sink 3 made of a Cu-W alloy (Cu 10 wt %) is so fitted in the opening 21 from above the ceramics plate 2 as to cover the opening 21 of the ceramics plate 2 with the edge of the heat sink 3 attached to the upper edge of the ceramics plate 2 at an area of the opening 21. A bonding agent layer 4, such as a silver solder, is interposed at a contact area between the heat sink 3 and the ceramics plate 2 to join the heat sink 3 to the ceramics plate 2. An attaching screw 32 is provided on the upper surface side of the heat sink 3 whereby a heat radiating fin unit 8 made of aluminum is attached to the heat sink 3.

A semiconductor element 1 is joined to the lower surface of the heat sink 3 by a bonding agent not shown. Connection electrodes 11 are provided on the semi-conductor element 1 and electrically connected to the interconnection pattern by the connection leads 6. As the connection method use is made of a wire bonding method using Al wires and Au wires, a TAB (Tape Automated Bonding) method using a tape carrier, and so on.

The semiconductor element 1 is sealed with a cap 7 made of a Fe-Ni-Co alloy, etc., and a sealing ring 22. The sealing ring 22 is fixed to the lower surface of the ceramics plate 2 by a bonding agent, not shown, such as a silver solder and jointed to the cap 7 by a bonding agent, not shown, such as an AuSn eutectic solder. Connection pins 5 serving as external terminals of the semiconductor device are mounted erect at the lower surface portion of the outer edge portion of the ceramics plate 2 and electrically connected to the interconnection pattern.

The semiconductor device is mounted to a circuit board, not shown, such as a printed circuit board, where connection electrodes are provided. The forward ends of the connection pins 5 on the semiconductor device are contacted, under heating and pressure, with the connection electrodes. In this way, the semiconductor device is mounted on the surface of the circuit board. Although the connection pins 5 are arranged in five arrays in the conventional device, there has been a tendency that more arrays are adopted with an increase in the high integration density of the semiconductor element.

With the semiconductor device operated, heat is evolved in the semiconductor element. For such heat evolved, the heat sink 3 and heat radiating fin unit 8 are provided for adequate heat radiation. The evolution of the heat expands the ceramics plate 2, heat sink 3, etc. The extent of the thermal expansion differs from member to member. In the semiconductor device with the respective members bonded and assembled in various combinations, mechanical or thermal stress tends to be concentrated to a specific area, sometimes causing such a stressed member to a breakage. In order to prevent concentration of the stress, use has to be made of those materials whose thermal expansion coefficients are near to each other.

For the conventional semiconductor device it is considered that, as a material near in thermal expansion coefficient ($28 \times 10^{-7}$/°C., 0° to 200° C.) to silicon of the semiconductor element 1 proper, for example, alumina with a thermal expansion coefficient of $66 \times 10^{-7}$/°C. (0° to 200° C.) is used for the ceramics plate 2 and a Cu-W alloy (Cu 10 wt %) with a thermal expansion coefficient of $65 \times 10^{-7}$/°C. (0° to 200° C.) is used for the heat sink 3. The selection of such materials can prevent generation of the stress to some extent. With a recent rapid tendency to a high speed/high integration density of a semiconductor device, such a countermeasure is not adequate in a present situation where the size of the semiconductor element is as large as over 17.5 mm square and a dissipation power reaches 20 W for a class using over 800 connection pins.

Referring to FIGS. 3A and 3B, explanation will be given below about the manner in which a crack occurs in a ceramics plate of a semiconductor device due to such stress involved. FIG. 3A is a plan view showing a ceramics plate and a heat sink mounted to the ceramics plate and FIG. 3B is a cross-sectional view as taken along line 3B—3B in FIG. 3A.

The ceramics plate 2 has an opening 21 at its central area and a heat sink 3 is fixed by a bonding agent layer 4 to the inner surface and lower surface edge portion of the opening 21. If the semiconductor device, not shown, is operated in that state, the ceramics plate 2 and heat sink 3 become elongated due to heat involved. Since, in this case, both are so selected as to be near in their thermal expansion coefficients to each other, their elongations differ due to some difference caused between the ceramics plate and the heat sink 3. This produces a warp in the ceramics plate 2 and stress is concentrated in an easily affected spot, thus producing a crack 9 there. Naturally, stress is also developed when the semiconductor device is cooled.

With the semiconductor device as shown in FIG. 1, the semiconductor element 1 is mounted to the surface of the heat sink 3 by an electroconductive bonding agent such as a Pb-Ag solder and silver paste. Upon mounting, however, any excess electroconductive bonding agent reaches the interconnection pattern on the surface of the ceramics plate 2, thus posing an interconnection short-circuit problem.

SUMMARY OF THE INVENTION

A first object of the present invention is to provide a semiconductor device which can improve the mechanical strength of a ceramics package by enhancing strength at those areas of an opening of a ceramics plate for use in a semiconductor device which are liable to be affected by mechanical and/or thermal stress involved.

A second object of the present invention is to provide a semiconductor device which can achieve improved mechanical strength of a ceramics package by enhancing strength at those corners of an opening of a ceramics plate liable to be affected by mechanical or thermal stress.

A third object of the present invention is to provided a semiconductor device which can improve mechanical strength of a ceramics package by enhancing strength at those areas of an opening of a ceramics plate liable to be affected by mechanical and/or thermal stress involved, can ensure ready use of a TAB technique in making electrical connection between a semiconductor element in a ceramics package and an interconnection pattern of the ceramics plate, and can be fixedly and positively joined to the ceramics plate.

A fourth object of the present invention is to provided a semiconductor device which can enhance mechanical strength of a ceramics package by enhancing strength at those areas of an opening of a ceramics plate liable to be affected by mechanical/thermal stress involved and can prevent short-circuiting of connection layers by a conductive bonding agent which is used in fixedly joining a semiconductor element to a heat sink of a ceramics package.

The first object of the present invention is achieved by a semiconductor device comprising: a ceramics plate having first and second major surfaces and an opening; a heat sink having first and second major surface and joined by a bonding agent layer to the ceramics plate to cover the opening of the ceramics plate, the bonding agent layer being formed between the first major surface of the heat sink and an inner edge portion of the opening on the second major surface side of the ceramics plate; a semiconductor element mounted on the first major surface of the heat sink and located in the opening of the ceramics plate; a cap mounted on the first major surface of the ceramics plate to cover the semiconductor element; and a stress relieving means provided in the opening of the ceramics plate at those areas where stress is concentrated.

The second object of the present invention is achieved by a semiconductor device comprising: a ceramics plate having first and second major surfaces and an opening; a heat sink having first and second major surfaces and joined by a bonding agent layer to the ceramics plate to cover the opening of the ceramics plate, the bonding agent layer being formed between the first major surface of the heat sink and an inner edge portion of the opening on the second major surface side of the ceramics plate; a semiconductor element mounted on the first major surface of the heat sink and located in the opening of the ceramics plate; a cap mounted on the first major surface of the ceramics plate to cover the semiconductor element; and stress relieving means formed at those corners of the opening in the ceramics plate.

The third object of the present invention is achieved by a semiconductor device comprising: a ceramics plate having first and second major surfaces and an opening; a heat sink having first and second major surfaces and joined by a bonding agent layer to the ceramics plate to cover the opening of the ceramics plate, the bonding agent layer being formed between the first major surface of the heat sink and an inner edge portion of the opening on the second major surface side of the ceramics plate and the first major surface of the heat sink being projected as a projection into the opening; a semiconductor element mounted on the first major surface of the heat sink and located in the opening of the ceramics plate; a cap mounted on the first major surface of the ceramics plate to cover the semiconductor element; and stress relieving means provided in the opening of the ceramics plate at those areas where stress is concentrated.

The fourth object of the present invention is achieved by a semiconductor device comprising: a ceramics plate having first and second major surfaces and an opening; a heat sink having first and second major surfaces and joined by a bonding agent layer to the ceramics plate to cover the opening of the ceramics plate, the bonding agent layer being formed between the first major surface of the heat sink and an inner edge portion of the opening on the second major surface side of the ceramics plate, the first major surface of the heat sink being projected as a projection into the opening and a clearance being provided between the projection of the heat sink and an inner side wall of the opening of the ceramics plate; a semiconductor element mounted on the first major surface of the heat sink and located in the opening of the ceramics plate; a cap mounted on the first major surface of the ceramics plate to cover the semiconductor element; and stress relieving means provided in the opening of the ceramics plate at those areas where stress is concentrated.

By providing the stress relieving means at those stress-concentrated areas of the opening in the ceramics plate, it is possible to enhance the mechanical strength of the ceramics package. Further, it is also possible to impart an enhanced mechanical strength to the ceramics package by providing the stress relieving means at those corners of the opening of the ceramics plate liable to be affected by stress involved. According to the present invention, the projection of the first major surface of the heat sink is projected into the opening of the ceramics plate to cover the opening, so that the heat sink can be mounted stably in the ceramics plate and the present embodiment permits the use of the TAB technique as a method for connecting the semiconductor element by lead wires to the interconnection pattern of the ceramics plate. In addition, a clearance is defined between the inner side wall of the opening and the projection of the heat sink projected into the opening of the ceramics plate, whereby, even if the conductive bonding agent for fixedly joining the semiconductor element to the heat sink leaks from between the heat sink and the semiconductor element, the leaking conductive bonding agent can be escaped in the clearance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a plan view showing a ceramics plate and a heat sink mounted therein;

FIG. 3B is a cross-sectional view as taken along line 3B—3B in FIG. 3A;

FIG. 6 is a cross-sectional view, as taken along line 6—6 in FIG. 4;

FIG. 7 shows a characteristic curve representing a stress dependence on a curvature radius R of those corners of an opening of a ceramics plate with the ordinate axis showing a stress σ1 (kgf/mm$^2$) on the ceramics plate and the abscissa axis the curvature radius of the corners above;

FIG. 14 is a table showing a relation of stress σ2 to the configurations of the ceramics plates and of a stress δ1 upon thermal shock testing to a breakage probability F.

DETAILED DESCRIPTION OF THE PREFERRED EMBODIMENTS

Embodiments of the present invention will be explained below with reference to the accompanying drawings.

Figure 1:
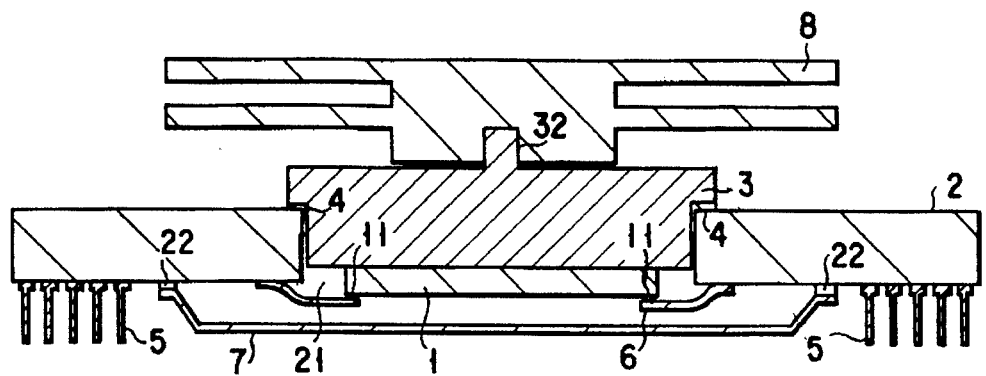
FIG. 1 is a cross-sectional view showing a conventional semiconductor device.
Figure 2:
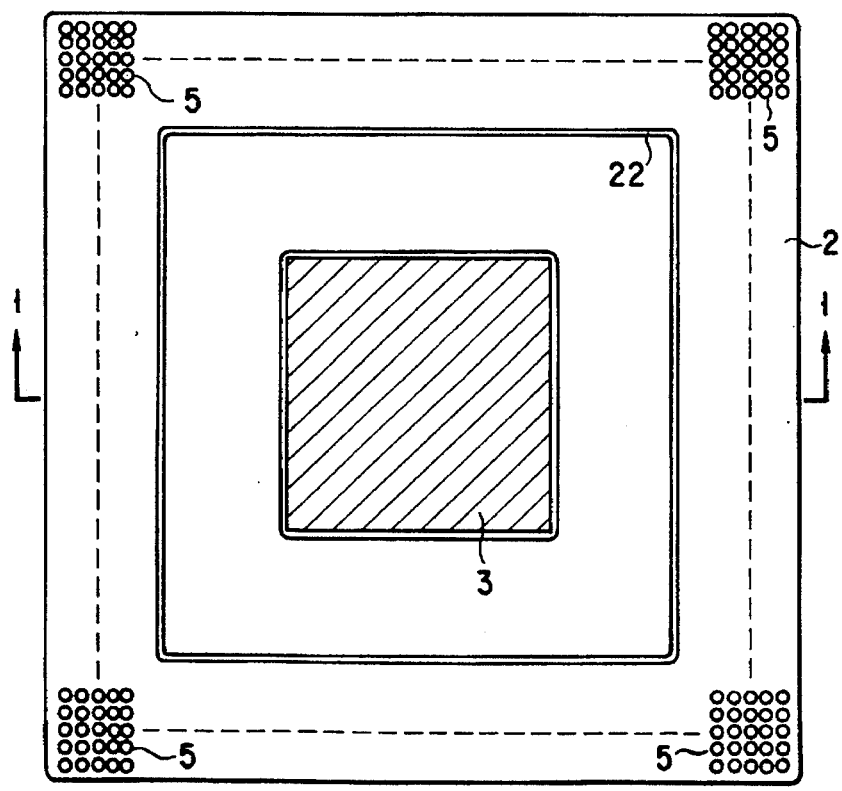
FIG. 2 is a bottom view showing the conventional semiconductor device of FIG. 1.
Figure 4:
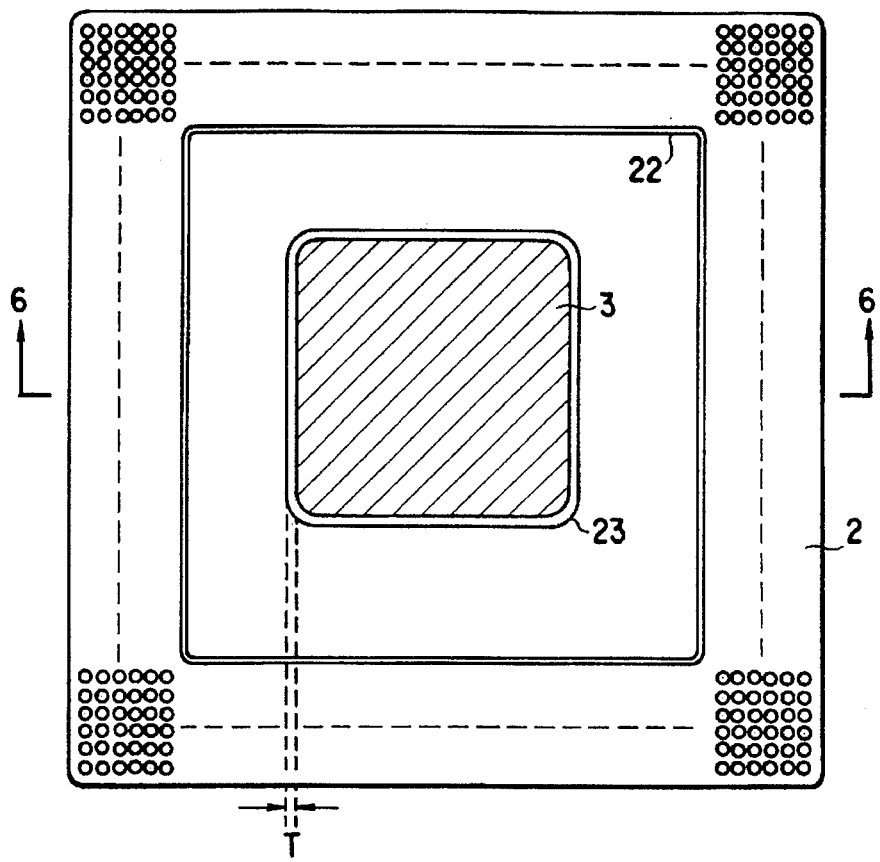
FIG. 4 is a plan view showing a semiconductor device according to a first embodiment of the present invention.
Figure 5:
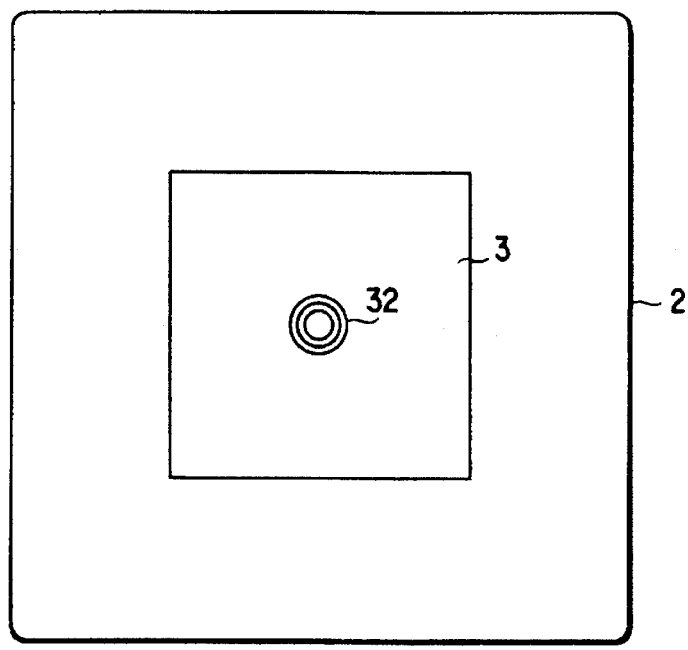
FIG. 5 is a bottom view showing a semiconductor device shown in FIG. 4.

FIG. 4 is a plan view showing a semiconductor device according to a first embodiment of the present invention, that is, a view showing an upper surface (a first major surface) of a ceramics plate with a heat sink mounted therein. FIG. 5 is a plan view of the semiconductor device shown in FIG. 4, that is, a view showing a lower surface (second major surface) of the ceramics plate with a heat sink mounted therein. FIG. 6 is a cross-sectional view as taken along line 6—6 in FIG. 4.

The ceramics plate 2 constituting a package is made of alumina ($Al_2O_3$ 90 wt %), etc., and has an opening 21 at its central area. The ceramics plate 2 has a square major surface of, for example, about 60 mm square and a thickness of, for example, about 1.9 mm. The opening 21 has a substantially square shape of about 24.5 mm square where a square semiconductor element (chip) is mounted. In this connection it is to be noted that, more accurately, the opening 21 has corners 23 of a larger curvature radius R each. The curvature radius R is 1.0 mm. An opening conventionally used had a curvature radius R of about R=0.5 mm at most at its corners provided simply as somewhat curved ones.

The ceramics plate 2 has a multi-layered interconnection pattern, not shown, as viewed at those areas of its upper surface (first major surface) and inside. The ceramics plate 2 is formed by coating a paste-like metal, such as Mo, W or Mo-Mn, on about 0.3 mm-thick ceramics green sheets, patterning the metals of these green sheets by, for example, a screen printing method and baking, for example, seven such patterned green sheets at about 1500° C. In sintering, connection is made among the respective interconnection pattern layers with the metal paste buried in an initially formed through hole in the respective green sheet. If, after sintering, for example, Ni- or Au-plating is made on the interconnection pattern surface of the top layer of the sheets, connection can readily been made to the semiconductor element and wire bonding can also readily be effected relative to those Au and Al lines.

A heat sink 3 of a Cu-W alloy (Cu 10 wt %) is fitted in the opening 21 of the ceramics plate 2 to cover the opening 21. The thermal expansion coefficient of the Cu-W alloy is near to that of the alumina. A bonding agent layer 4, such as a silver solder, is coated on a portion of the opening 21 near to a lower surface (second major surface) of the ceramics plate 2. The heat sink 3 is fixed by the bonding agent layer 4 to the ceramics plate 2 with a central projection 31 of the heat sink 3 situated in the opening 21. The heat sink 3 is about 0.55 mm thick at its outer edge portion and about 2.45 mm thick at its projection 31 area and has a side length of about 28.5 mm in which case the central projection 31 has a side length of about 23.9 mm.

A mount screw 32 is provided on the lower surface (second major surface) of the heat sink 3 and a heat radiating fin unit 8 is fixedly mounted by the mount screw 32 to the lower surface (second major surface) of the heat sink 3.

A semiconductor element 1 is fixed by a bonding agent, not shown, to the upper surface (first major surface) of the projection 31 of the heat sink 3. The semiconductor element 1 is comprised of a chip having one side of, for example, 20 mm. Connection electrodes 11 are provided on the upper surface (first major surface) of the semiconductor element 1 and electrically connected by connection leads 6 to the interconnection patterns of the multi-layered structure of the ceramics plate 2. That is, bonding is achieved by the connection leads 6 between the connection electrodes 11 formed on the upper surface (first major surface) of the semiconductor element 1 and the interconnection pattern formed on the upper surface (first major surface) of the ceramics plate 2. As the bonding method, use is made of a wire bonding method using thin lines such as Al lines and Au lines and a TAB (Tape Automated Bonding) technique utilizing a tape carrier, but the TAB technique is employed in this embodiment.

The semiconductor element 1 is sealed by a cap 7 made of an Fe-Ni-Co alloy, etc., and sealing ring 22. That is, a bonding agent, not shown, such as a silver solder, is coated on the upper surface (first major surface) of the ceramics plate 2 and the sealing ring 22 is fixedly joined by this bonding agent to the upper surface (first major surface) of the ceramics plate 2. The sealing ring 22 is joined to the cap 7 by an AuSn eutectic solder, etc., coated on the outer edge portion of the cap 7.

Connection pins 5 are provided on the outer marginal portion of the upper surface (first major surface) of the ceramics plate 2 and serve as external terminals of the semiconductor device. As the connection pins 5, 820 pins are arranged in five arrays. These connection pins 5 are electrically connected to connection layers, not shown, provided inside the ceramics plate 2 and the connection layers are electrically connected to the multi-layered interconnection pattern formed at those areas of the upper surface (first major surface) and inside of the ceramics plate 2.

The semiconductor device is mounted on a circuit board, not shown, such as a printed circuit board. Respective electrode pads (connection electrodes) are provided on the circuit board and electrically connected to the interconnection pattern. The connection pins 5 at the semiconductor device have their forward ends contacted with the corresponding electrode pads under heating and pressure. By so doing, the semiconductor device is mounted on the surface of the circuit board.

According to the first embodiment, a greater curvature radius R serving as a stress relieving means is provided at those corners of the opening 21 of the ceramics plate 21 where stress are highly concentrated. At the corners of the opening of the ceramics plate more liable to produce a crack on a conventional semiconductor device it is possible, according to the present invention, to noticeably reduce the generation of cracks.

In the first embodiment, although alumina is used as the material of the ceramics plate 2, the material of the ceramics plate is not restricted thereto and other materials may be used so long as these materials have a greater thermal conductivity and a thermal expansion coefficient close to that of silicon. For example, aluminum nitride (ALN) can be listed because it has a thermal expansion of $33 \times 10^{-7}/°C$. (0° to 200° C.) closer to that of silicon and a thermal conductivity as great as 230 W/m·k(25° C.).

Further, although the Cu-W alloy (Cu 10 wt %) is used as the material of the heat sink 3, it is possible to use, as the material of the heat sink 3, a CuW alloy containing about 10 to 20 wt % of Cu.

Although the 820 connection pins are arranged in the five arrays, more pins can be arranged in more arrays with an increasing integration density.

Although the projection 31 is provided at the heat sink 3, a flat-plate heat sink may be mounted on the ceramics plate.

Figure 8:
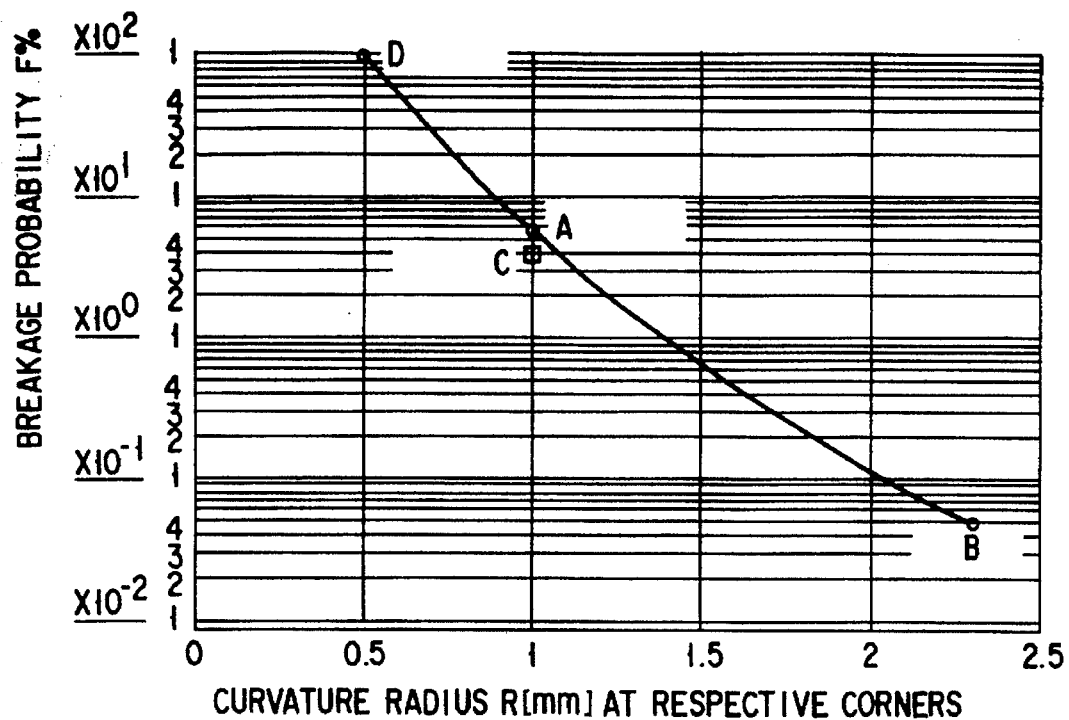
FIG. 8 shows a characteristic curve representing a dependence of a breakage probability F(%) of a ceramics package on a curvature radius R of those corners of an opening of the ceramics plate with the ordinate axis showing the breakage probability above and the abscissa axis the curvature radius R of the corners of the opening above.

The functional advantage of the stress relieving means of the present embodiment will be explained below with reference to FIGS. 7 and 8. The greater curvature radius R portion serving as the stress relieving means is provided at the corners of the opening of the ceramics plate. Comparison is made among those stresses generated at the corners of the opening of the ceramics plate by varying their curvature R, noting that use is made of the ceramics plate, heat sink and semi-conductor element the same as those of the first embodiment. The curvature radius R is varied over a range from about 0.5 mm to about 2.5 mm. FIG. 7 shows a stress σ1 upon thermal shock testing of the constituent materials of a ceramics package such as the ceramics plate, heat sink and sealing ring, fixedly joined at 400° C. and then cooled down to −65° C. In FIG. 7, the ordinate shows a stress σ1 (kgf/mm$^2$) applied to the ceramics package and the abscissa the curvature radius R at the corners of the opening of the ceramics plate, that is, a characteristic curve representing the dependence of the stress upon the curvature radius. In the characteristic curve shown, A shows the configuration of the corner for R=1.0 mm; B, for R=2.3 mm and D, for R=0.5 mm. Further, C in FIG. 7 shows a circular part of R=1.0 at the corner, the circular part extending toward the rest of the ceramics plate. FIG. 8 shows a breakage percentage F of the ceramics package having the above corner configuration. That is, FIG. 8 shows a characteristic curve illustrating the dependence of the breakage percentage upon the curvature radius R, that is, the ordinate representing the breakage percentage F (%) and the abscissa the curvature radius R at the corners of the opening of the ceramics plate. In this connection it is to be noted that A, B, C and D in FIG. 8 correspond to those in FIG. 7.

It has been the usual practice to provide a radius R at the corner in the manufacture of the conventional ceramics products. In those packages for this type of semiconductor device, the opening of the ceramics plate had the curvature radius R of about R= about 0.5 mm at each corner. Even when thermal shock testing was conducted, in a heat cycle of −65° C. to 150° C., on those conventional ceramics plates having the curvature radius of the extent above, the breakage percentage F, that is, a crack occurrence rate was very high of the order of 98%. According to the present invention, on the other hand, the ceramics plates, increasing their curvature radius R in the opening, were able to decrease occurrence of local stress there and hence to markedly reduce the breakage probability F. By increasing the radius R from 0.5 mm to 2.3 mm it was possible to greatly decrease the breakage probability F from 98% to 0.049%. This is probably due to the fact that stress concentration is distributed with the increasing curvature radius R at the corners of the opening. The corner of the opening is provided as a curved area between a straight line of its given side and that of an adjacent side. The broader the curved area the more distributed the stress is.

FIG. 14 shows a stress σ2 (kgf/mm$^2$) produced upon assembly of those semiconductor devices equipped with the ceramics plate of A to D as obtained at the result of testing. From FIG. 14 it has been found that, in order to decrease the breakdown probability F below about 0.1%, the radius R at the corners of the opening of the ceramics plate be made about above 2 mm.

As seen from FIGS. 4 and 6, a clearance T of about 0.5 to 0.6 mm is present between the projection 31 of the heat sink 3 and the inner side wall of the opening 21 of the ceramics plate 2. Even if a conductive bonding agent, not shown, for bonding the semiconductor element 1 to the heat sink 3 leaks, it is accumulated in the clearance T between the heat sink 3 and the semiconductor element 1 so that short-circuiting can be prevented from occurring at the connection layers.

Although in the first embodiment the clearance T is provided between the projection 31 and the inner side wall of the opening 21, the projection 31 of the heat sink 3 may be contacted with the inner side wall of the opening 21 without providing any such clearance T.

Figure 9:
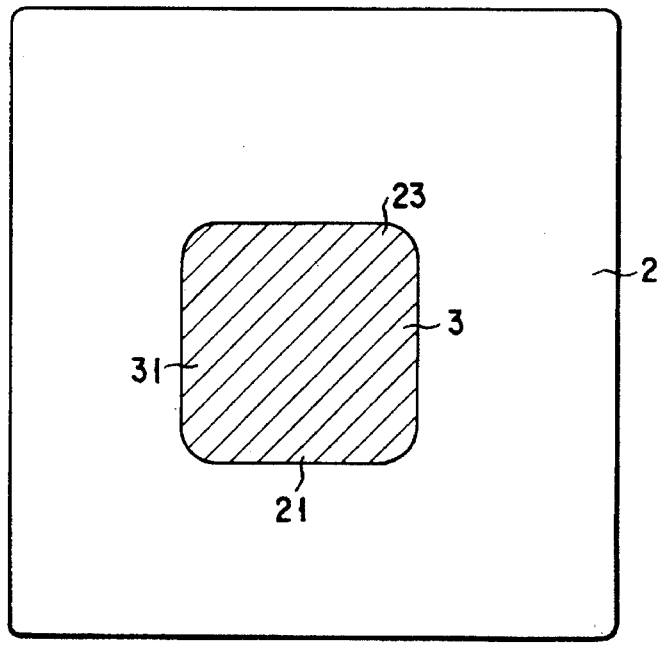
FIG. 9 is a plan view showing the ceramics plate and the heat sink mounted there in the embodiments.
Figure 10:
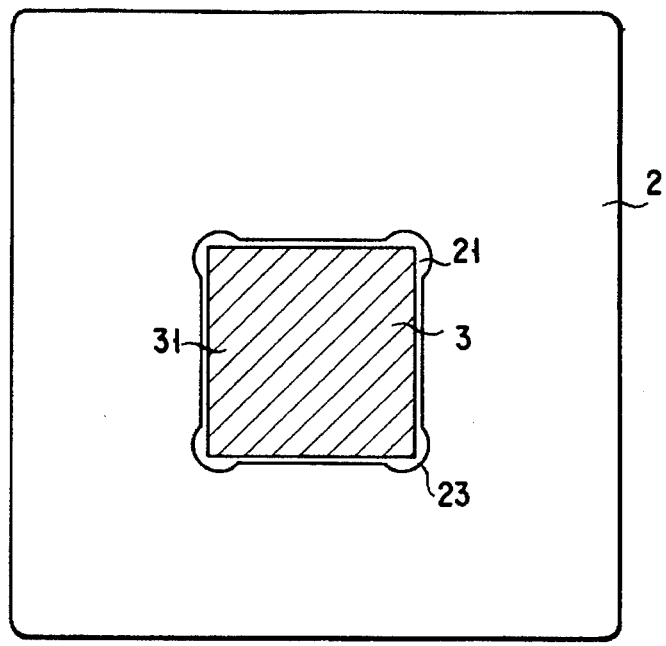
FIG. 10 is a plan view showing one form of a ceramics plate and heat sink mounted therein.
Figure 11:
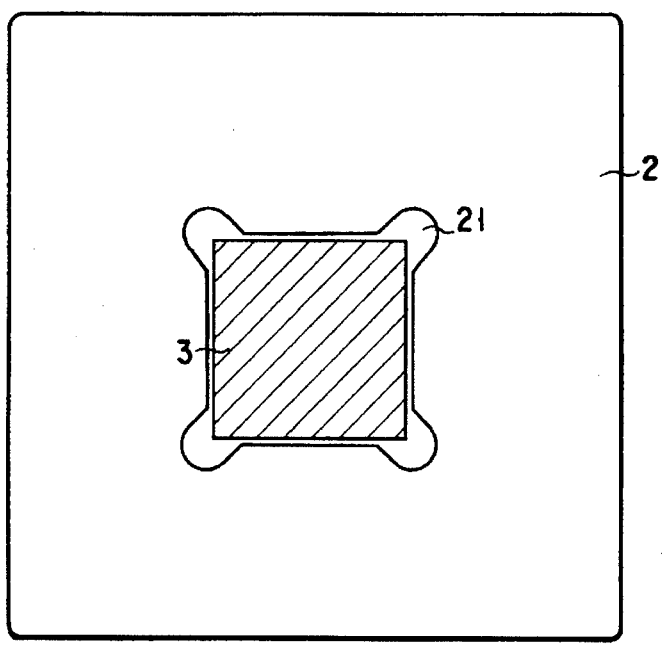
FIG. 11 is a plan view showing another form of a ceramics plate and heat sink mounted therein.

An explanation will be given below about the ceramics plate of the present embodiment and configuration of the heat sink mounted thereto by referring to FIGS. 9 to 11. FIGS. 9 to 11, each, are a plan view showing a ceramics plate with a heat sink fitted in its opening, noting that the size and material of a ceramics plate and size of an opening are the same as those of the semiconductor device shown in FIG. 4. In FIG. 9, the corner 23 of the opening 21 has a curvature radius R of R=2.3 mm the same as that of the corner B of the opening explained in connection with FIGS. 7 and 8. A projection 31 of the heat sink 3 is fitted in an opening 21 and is the same in planar view as that of the opening 21, leaving a clearance, not shown, between the projection 31 and the inner side wall of the opening 21. It is not necessary that the planar configuration of the projection 31 be made the same as that of the opening 21. Assuming that the corner of the projection 31 has a smaller or no radius R, the length of one side of the projection 31 is much smaller than that of the opening 21, thus failing to mount a larger-sized semiconductor element on the upper surface (first major surface) of the projection 31.

In one form of FIG. 10, the corner has a semicircular part R of R=1.0 recessed toward the rest of the ceramics plate and having the same shape as that of the corner C of the opening explained in FIG. 7, etc. A boundary portion between the semi-circular part of the opening 21 and the straight portion of the opening 21 has a curvature radius R of R=0.5 mm. A projection 31 of a heat sink 3, being fitted in the opening 21, is the same in its planar shape as the opening 21 except at those corners 23 and a clearance is provided between the projection 31 and the inner side wall of the opening 21.

With the ceramics plate as shown in FIG. 10, the opening is semi-circular at its corners and, even if it is the same in R as the corner A area shown in FIG. 7, that area is broadened, allowing stress to be dispersed so that the breakage probability F is lowered.

In this connection it is to be noted that the planar configuration of the corner of the heat sink 3 provided at the corner 23 need not be made semi-circular as in the case of the opening 21.

In another form of FIG. 11, the corner 23 of the opening 21 is made part-elliptical instead of being semi-circular. That curved area, being more broadened than the semi-circular area, further lowers the breakage probability.

Figure 12:
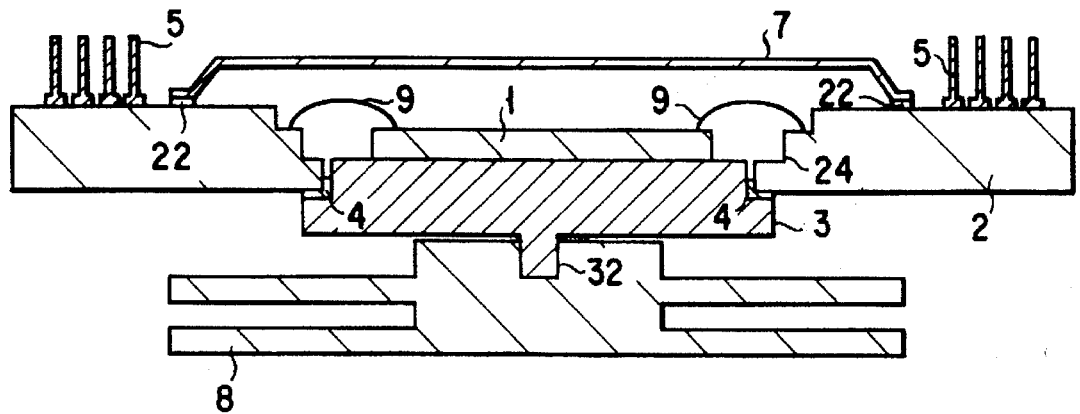
FIG. 12 is a cross-sectional view showing a semiconductor device according to a second embodiment of the present invention.
Figure 13:
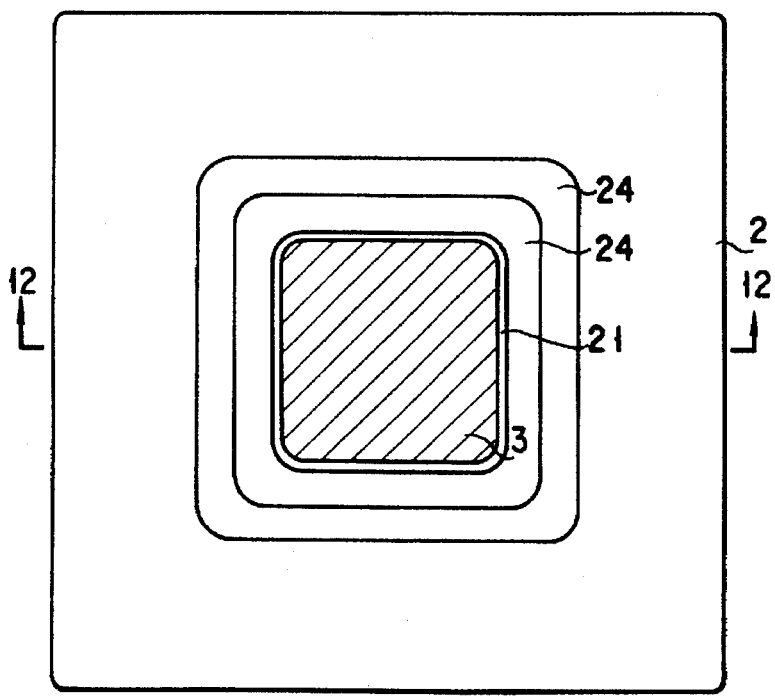
FIG. 13 is a plan view showing a ceramics plate of a ceramics package used in the semiconductor device shown in FIG. 12.

A second embodiment of the present invention will be explained below with reference to FIGS. 12 and 13. FIG. 12 is a cross-sectional view showing a semiconductor device of the second embodiment. FIG. 13 is a plan view showing a ceramics plate of a ceramics package for use in the semiconductor device shown in FIG. 12. FIG. 12 is a cross-sectional view as taken along line 12—12 in FIG. 13.

That ceramics plate 2 made of alumina constitutes a package and has an opening 21 at its central area. The ceramics plate 2 has a major surface of a square configuration. The opening 21 has a square semiconductor element (chip) mounted therein and is made substantially square in configuration with one side about 19.5 mm in length. That is, the opening 21 is not exactly square in configuration and has a greater curvature radius R of R=1.0 mm. Further, a step 24 is provided at the inner edge portion of the opening 21. A multi-interconnection pattern, not shown, is formed at an area including an upper surface (first major surface) and interior of the ceramics plate 2. The interconnection pattern is partly exposed at the step 24. The ceramics plate 2 is provided by forming a pattern, by a screen printing method for example, on about 0.3 mm-thick ceramics green sheets with the use of a paste metal, such as Mo, W and Mo-Mn, superimposing them one above another and sintering a resultant superimposed unit at about 1500° C. Upon sintering, the connection of the respective interconnection pattern is achieved by initially providing through holes in the green sheets and burying the paste metal in the through holes.

A heat sink made of Cu-W alloy (Cu 10 wt %) is mounted in the opening 21 to cover the opening 21. The heat sink 3 is joined to the lower surface of the ceramics plate 2 by a bonding agent layer 4 such as a silver solder. A projection 31 is provided on the upper surface (first major surface) of the heat sink 3 and situated more toward the central side of the ceramics chip from the bonding agent layer 4 area at the inner edge of the ceramics plate such that the projection 31 is jutted into the opening 21 to an extent corresponding to a bottom level of the step 24. A semiconductor element 1 is composed of a chip with one side, for example, 17.5 mm in length and fixedly joined to the surface of the heat sink 3, that is the upper surface (first major surface) of the heat sink, by a bonding agent not shown. Connection pins 5 are provided upright on the outer marginal portion of the upper surface (first major surface) of the ceramics plate 2 and serve as external terminals of the semiconductor device. In the mounting of the semiconductor device on a circuit board such as a printed circuit board, surface mounting is achieved by making the forward ends of the respective connection pins 5 contacted, under heating and pressure, with corresponding electrode pads on the interconnection pattern of the circuit board. In the embodiment, 391 pins are arranged as the connection pins 5. The connection pins 5 are electrically connected to the multi-interconnection pattern at those areas corresponding to the upper surface and interior of the ceramics plate 2 through the connection layers, not shown of the ceramics plate 2. The multi-interconnection patterns of the semiconductor element 1 are electrically connected to those of the ceramics plate 3 by bonding wires 9 such as Au and Al.

Bonding wires 9 join the step 24 area of the ceramics plate 2 to the connection electrodes 11 on the major surface of the semiconductor element 1. The semiconductor element 1 is mounted on the ceramics package such that it is sealed by a sealing ring 22 and cap 7 made of an Fe-Ni-Co alloy. The sealing ring 22 is fixed to the upper surface (first major surface) of the ceramics plate 2 by a bonding agent, not shown, such as a silver solder and bonded to the cap 7 by a bonding agent, an AuSn eutectic solder, etc., not shown, coated on the marginal portion of the cup 7. A mount screw 32 for fixing a heat radiating fin unit in place is provided on the lower surface (second major surface) of the heat sink 3 exposed from the ceramics package. That heat radiating fin unit 8 made of, for example, Al is mounted on the lower surface of the heat sink 3 by the mount screw 32.

In the second embodiment, those connection pins for connection to an external circuit such as a circuit board are mounted on the upper surface (first major surface) of the ceramics plate, that is, on that upper surface side where the cap for the ceramics plate is connected. This is because, if these connection pins are mounted on the lower surface (second major surface) of the ceramics plate, mounting on the circuit board becomes more difficult due to the presence of the heat radiating fin unit provided on the lower surface of the heat sink. Further, the heat radiating characteristic of the heat radiating fin unit is lowered. Thus the second embodiment can achieve both ready mounting of the connection pins on the upper surface (first major surface) of the ceramics plate and improved heat radiation characteristic.

The present invention can apply to not only a semiconductor device equipped with such connection pins as arranged as set out above but also a semiconductor device equipped with connection pins mounted, for example, on the lower surface (second major surface) of the ceramics plate. Further, the present invention can also apply to a semiconductor device where the connection layers buried in the ceramics plate are electrically connected to external leads mounted on the side surface of the ceramics plate.

According to the first and second embodiments, a stress relieving means is provided at those areas of the opening where stress is concentrated. By doing so, the ceramics plate produces less stress on the areas above due to the dispersion of stress involved. Hence, the ceramics plate produces less cracks and can do so particularly at each corner of its opening.

The heat sink can be fitted in the ceramics plate with its upper surface (first major surface) projected in the opening of the ceramics plate so that it covers the opening of the ceramics plate. By doing so, it is possible to stably mount the heat sink in place in the ceramics plate. The present invention allows the ready use of a TAB technique as a method for connecting the semiconductor element by lead lines to the interconnection pattern in and on the ceramics plate.

According to the present invention, a clearance is provided between the projection of the heat sink in the opening of the ceramics plate and the inner side wall of the opening of the ceramics plate whereby, even if the conductive bonding agent for fixing the semiconductor element to the heat sink leaks from between the heat sink and the semiconductor element, the bonding agent enters into the clearance to prevent short-circuiting between the lead lines.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
   a ceramic plate having first and second major surfaces and an opening having corners;
   a heat sink having first and second major surfaces and joined by a bonding agent layer to the ceramic plate to cover the opening of the ceramic plate, the bonding agent layer being formed between the first major surface of the heat sink and an inner edge portion of the opening on the second major surface side of the ceramic plate;
   a semiconductor element mounted on the first major surface of the heat sink and located in the opening of the ceramic plate; and
   a cap mounted on the first major surface of the ceramic plate to cover the semiconductor element;
   wherein each of the corners of the opening in the ceramic plate has a curvature radius R of 2.3 mm.

2. The semiconductor device according to claim 1, wherein the first major surface of the heat sink covers the opening of the ceramic plate and provides a projection having corners jutted into the opening of the ceramic plate, the corners of the projection having a curvature radius smaller than the radius R.

3. The semiconductor device according to claim 1, further including a step provided in an inner edge portion of the opening in the ceramics plate.

4. The semiconductor device according to claim 3, wherein a clearance is provided between an inner side wall of the opening in the ceramics plate and the projection of the first major surface side of the heat sink jutted into the opening of the ceramics plate.

5. The semiconductor device according to claim 3, wherein the first major surface of the heat sink covers the opening of the ceramic plate and provides a projection jutted into the opening of the ceramic plate.

6. The semiconductor device according to claim 4, further comprising connection pins provided on an outer marginal portion of the first major surface of the ceramics plate and adapted to be electrically connected to the semiconductor element.

7. The semiconductor device according to claim 5, further comprising a heat radiating fin unit mounted on the second major surface of the heat sink.

8. The semiconductor device according to claim 5, wherein a clearance is provided between an inner side wall of the opening in the ceramics plate and the projection of the first major surface side of the heat sink jutted into the opening of the ceramics plate.

9. The semiconductor device according to claim 8, further comprising connection pins provided on an outer marginal portion of the first major surface of the ceramics plate and adapted to be electrically connected to the semiconductor element.

10. The semiconductor device according to claim 9, further comprising a heat radiating fin unit mounted on the second major surface of the heat sink.

11. A semiconductor device comprising:
    a ceramic plate having first and second major surfaces and an opening having corners;
    a heat sink having first and second major surfaces and joined by a bonding agent layer to the ceramic plate to cover the opening of the ceramic plate, the bonding agent layer being formed between the first major surface of the heat sink and an inner edge portion of the opening on the second major surface side of the ceramic plate;
    a semiconductor element mounted on the first major surface of the heat sink and located in the opening of the ceramic plate; and
    a cap mounted on the first major surface of the ceramic plate to cover the semiconductor element;
    wherein each of the corners of the opening in the ceramic plate has a recessed semi-circular area having a curvature radius R equal to 1.0 mm, the semi-circular area being recessed toward an outer side of the ceramic plate.

12. The semiconductor device according to claim 11, wherein the first major surface of the heat sink covers the opening of the ceramic plate and provides a projection jutted into the opening of the ceramic plate, the projection having a square surface with corners located in the respective corners of the opening.

13. The semiconductor device according to claim 11, further comprising connection pins provided on an outer marginal portion of the first major surface of the ceramic plate and adapted to be electrically connected to the semiconductor element.

14. The semiconductor device according to claim 11, wherein the corners of the opening in the ceramic plate is such that their planar configuration is part-elliptical.

15. The semiconductor device according to claim 12, wherein a clearance is provided between an inner side wall of the opening in the ceramics plate and the projection of the first major surface side of the heat sink jutted into the opening of the ceramics plate.

16. The semiconductor device according to claim 13, further comprising a heat radiating fin unit mounted on the second major surface of the heat sink.

17. A semiconductor device comprising:
    a ceramic plate having first and second major surfaces and an opening having corners defined by line extensions of sides of the opening intersecting at an angle;
    a heat sink having first and second major surfaces and joined by a bonding agent layer to the ceramic plate to cover the opening of the ceramic plate, the bonding agent layer being formed between the first major surface of the heat sink and an inner edge portion of the opening on the second major surface side of the ceramic plate;
    a semiconductor element mounted on the first major surface of the heat sink and located in the opening of the ceramic plate; and a cap mounted on the first major surface of the ceramic plate to cover the semiconductor element;

the opening in the ceramic plate having a recess containing each of said corners and extending toward an outer side of the ceramic plate, said recess being defined at least in part by an arc of an angular length greater than the angle of line intersection at the respective contained corners.

18. A semiconductor device comprising:

a ceramic plate having first and second major surfaces and an opening having corners;

a heat sink having first and second major surfaces and joined by a bonding agent layer to the ceramic plate to cover the opening of the ceramic plate, the bonding agent layer being formed between the first major surface of the heat sink and an inner edge portion of the opening on the second major surface side of the ceramic plate;

a semiconductor element mounted on the first major surface of the heat sink and located in the opening of the ceramic plate; and a cap mounted on the first major surface of the ceramic plate to cover the semiconductor element;

wherein each of the corners of the opening in the ceramic plate has a curvature radius R of at least 2.0 mm.

19. A semiconductor device comprising:

a ceramic plate having first and second major surfaces and an opening having corners;

a heat sink having first and second major surfaces and a projection on the first major surface, said heat sink being joined by a bonding agent layer to the ceramic plate to cover the opening of the ceramic plate, said bonding agent layer being formed between the first major surface of the heat sink and an inner edge portion of the opening on a second major surface side of the ceramic plate, said projection being situated in said opening;

a semiconductor element mounted on the first major surface of the heat sink and located in the opening of the ceramic plate; and a cap mounted on the first major surface of the ceramic plate to cover the semiconductor element, wherein the corners of the opening in the ceramic plate and the corners of the heat sink are shaped so that surface spacing of the opening in the ceramic plate and the projection of the heat sink at each of the corners is greater than surface spacing between the opening in the ceramic plate and the projection of the heat sink at side surfaces thereof.

* * * * *

UNITED STATES PATENT AND TRADEMARK OFFICE
CERTIFICATE OF CORRECTION

PATENT NO. : 5,644,163
DATED : July 01, 1997
INVENTOR(S) : Ken-ichiro TSUJI

It is certified that error appears in the above-indentified patent and that said Letters Patent is hereby corrected as shown below:

Claim 4, column 11, line 46, "claim 3" should read --claim 2--.

Claim 7, column 11, line 60, "claim 5" should read --claim 6--.

Signed and Sealed this

Ninth Day of June, 1998

*Attest:*

BRUCE LEHMAN

*Attesting Officer*    Commissioner of Patents and Trademarks